(12) United States Patent
Lee et al.

(10) Patent No.: US 9,035,854 B2
(45) Date of Patent: May 19, 2015

(54) ORGANIC LIGHT EMITTING DIODE DISPLAY DEVICE AND FABRICATION METHOD THEREOF

(75) Inventors: Hyun-Ho Lee, Seoul (KR); Jae-Ho Sim, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 248 days.

(21) Appl. No.: 13/335,169

(22) Filed: Dec. 22, 2011

(65) Prior Publication Data

US 2012/0162053 A1 Jun. 28, 2012

(30) Foreign Application Priority Data

Dec. 24, 2010 (KR) ........................ 10-2010-0134890

(51) Int. Cl.
*H01L 27/32* (2006.01)
*G09G 3/32* (2006.01)

(52) U.S. Cl.
CPC ........ *H01L 27/3276* (2013.01); *H01L 27/3279* (2013.01); *G09G 3/3225* (2013.01); *H01L 27/3223* (2013.01)

(58) Field of Classification Search
CPC ............ H01L 27/3223; H01L 27/3244; H01L 27/3276; H01L 27/3279; H01L 33/36; G09G 3/32; G09G 3/3208; G09G 3/3225
See application file for complete search history.

(56) References Cited

U.S. PATENT DOCUMENTS

| | | | |
|---|---|---|---|
| 7,710,019 B2 | 5/2010 | Jung et al. | |
| 2004/0135520 A1* | 7/2004 | Park et al. | 315/169.3 |
| 2005/0139841 A1* | 6/2005 | Park | 257/79 |
| 2005/0140307 A1* | 6/2005 | Park | 315/169.3 |
| 2005/0179374 A1* | 8/2005 | Kwak | 313/506 |
| 2005/0248708 A1* | 11/2005 | Park et al. | 349/149 |
| 2006/0061524 A1* | 3/2006 | Suh et al. | 345/76 |
| 2007/0126728 A1* | 6/2007 | Peng | 345/211 |
| 2007/0170859 A1* | 7/2007 | Choi et al. | 313/512 |
| 2007/0267648 A1* | 11/2007 | Hwang et al. | 257/99 |
| 2008/0290343 A1* | 11/2008 | Lee et al. | 257/59 |
| 2009/0002283 A1* | 1/2009 | Park et al. | 345/76 |
| 2009/0303195 A1* | 12/2009 | Yamato et al. | 345/173 |
| 2010/0220091 A1* | 9/2010 | Choi | 345/213 |

FOREIGN PATENT DOCUMENTS

CN 1638567 A 7/2005

* cited by examiner

*Primary Examiner* — Dwayne Bost
*Assistant Examiner* — Stefan M Oehrlein
(74) *Attorney, Agent, or Firm* — Birch, Stewart, Kolasch & Birch, LLP (57) ABSTRACT

An organic light emitting diode (OLED) display device and a fabrication method thereof are provided. In the OLED display device, when an existing power wiring using a metal used for a data wiring is divided based on a common electrode marginal region as a boundary so as to be used as a wiring as well as as the power wiring, the reduced width of the wiring is compensated for by increasing the thickness of the wiring by using a metal for an anode or a cathode, thus reducing the left and right bezel widths.

13 Claims, 8 Drawing Sheets

ORGANIC LIGHT EMITTING DIODE DISPLAY DEVICE AND FABRICATION METHOD THEREOF

CROSS-REFERENCE TO RELATED APPLICATIONS

This application claims the benefit of earlier filing data and right of priority to Korean Patent Application No. 10-2010-0134890, filed on Dec. 24, 2010, the contents of which is hereby incorporated by reference for all purposes as if fully set forth herein in its entirety.

BACKGROUND OF THE INVENTION

1. Field of the Invention

The present invention relates to an organic light emitting diode (OLED) display device and a fabrication method thereof and, more particularly, to an OLED display device capable of reducing a bezel width therein and a fabrication method thereof.

2. Description of the Related Art

As the consumer's interest in information displays is growing and the demand for portable (mobile) information devices is increasing, research into and commercialization of light and thin flat panel displays ("FPD"), which substitute cathode ray tubes (CRTs), the conventional display devices, has been actively ongoing.

In the FPD field, a liquid crystal display (LCD), which is lighter and consumes less power, has come to prominence so far. However, the LCD is a light receiving device, rather than a light emitting device, having shortcomings in terms of brightness, a contrast ratio, a viewing angle, and the like, so a novel display device that may be able to overcome such shortcomings has been actively developed.

An organic light emitting diode (OLED) display device, one of novel display devices, is self-emissive, having excellent viewing angle and contrast ratio, and since it does not require a backlight, the OLED display device is lighter and thinner and is advantageous in terms of power consumption. In addition, the OLED display device has advantages in that it is available for DC low voltage driving and has a faster response speed, and also is advantageous in terms of fabrication costs.

Unlike the LCD or a plasma display panel (PDP), a fabrication process of the OLED display device includes only a deposition and encapsulation process, which is, thus, simple. Also, when the OLED display device is driven according to an active matrix scheme having a thin film transistor (TFT) as a switching element in each pixel, although a low current is applied, the same luminance can be obtained, so the LED display device has an advantage in that it can consume less power and high precision and resolution, and can be increased in size.

A basic structure and operational characteristics of the OLED display device will be described in detail with reference to the accompanying drawings.

Figure 1:
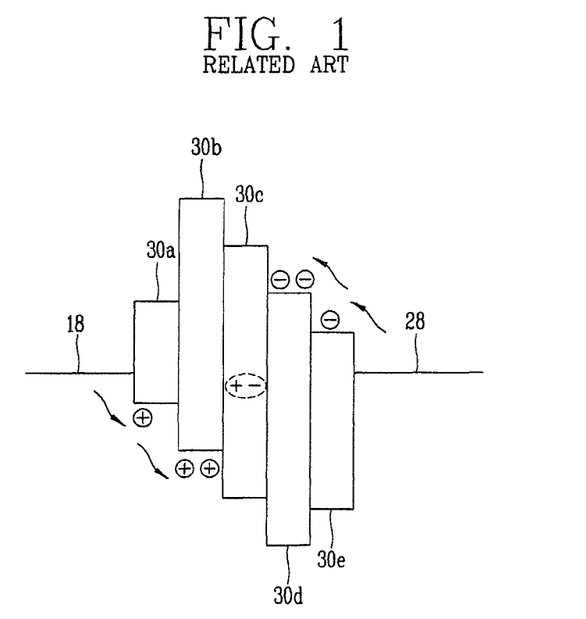
FIG. 1 is a diagram explaining a light emission principle of a related art organic light emitting diode (OLED) display device.

FIG. 1 is a diagram explaining a light emission principle of a related art OLED display device.

As shown in FIG. 1, the related art OLED display device includes an OLED. The OLED includes organic compound layers 30a, 30b, 30c, 30d, and 30e formed between an anode 18 as a pixel electrode and a cathode 28 as a common electrode.

The organic compound layers 30a, 30b, 30c, 30d, and 30e include a hole injection layer 30a, a hole transport layer 30b, an emitting layer 30c, an electron transport layer 30d, and an electron injection layer 30e.

When a driving voltage is applied to the anode 18 and the cathode 28, holes which have passed through the hole transport layer 30b and electrons which have passed through the electron transport layer 30d move to the emission layer 30c to form excitors, and as a result, the emission layer 30c emits visible rays.

In the OLED display device, pixels having the OLED having the foregoing structure, are arranged in a matrix form and selectively controlled by a data voltage and a scan voltage, thus displaying an image.

The OLED display device is divided into a passive matrix display device and an active matrix display device using TFTs as switching elements. Among them, in the active matrix display device, the TFTs are selectively turned on to select pixels and emission of pixels is maintained by the voltage maintained in a storage capacitor.

Figure 2:
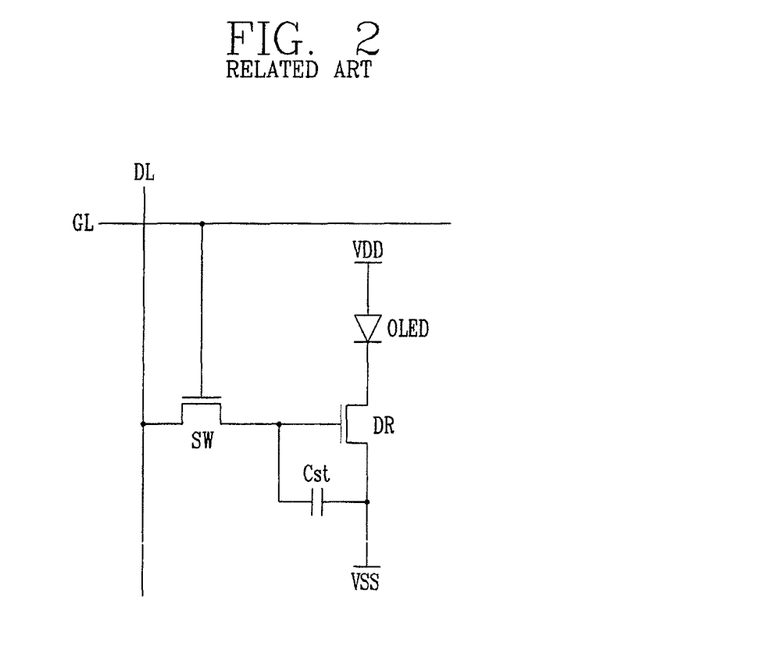
FIG. 2 is an equivalent circuit diagram of a single pixel in the related art OLED display device.

FIG. 2 is an equivalent circuit diagram of a single pixel in the related art OLED display device. Specifically, FIG. 2 is an equivalent circuit diagram of a related art 2T1C pixel (including two transistors and one capacitor) in the active matrix OLED display device.

With reference to FIG. 2, the pixel of the active matrix OLED display device includes an OLED, a data line DL and a gate line GL which cross each other, a switching TFT SW, a driving TFT DR, and a storage capacitor Cst.

Here, the switching TFT SW is turned on in response to a scan pulse from the gate line GL, thus electrically connecting a current path between a source electrode and a drain electrode thereof. During an ON-time period of the switching TFT SW, a data voltage from the data line DL is applied to a gate electrode of the driving TFT DR and the gate storage capacitor Cst through a source electrode and a drain electrode of the switching TFT SW.

Here, the driving TFT DR controls a current flowing through the OLED according to the data voltage applied to the gate electrode thereof. The storage capacitor Cst stores the voltage between the data voltage and a low potential power source voltage VSS, and then, uniformly maintains during one frame period.

Figure 3:
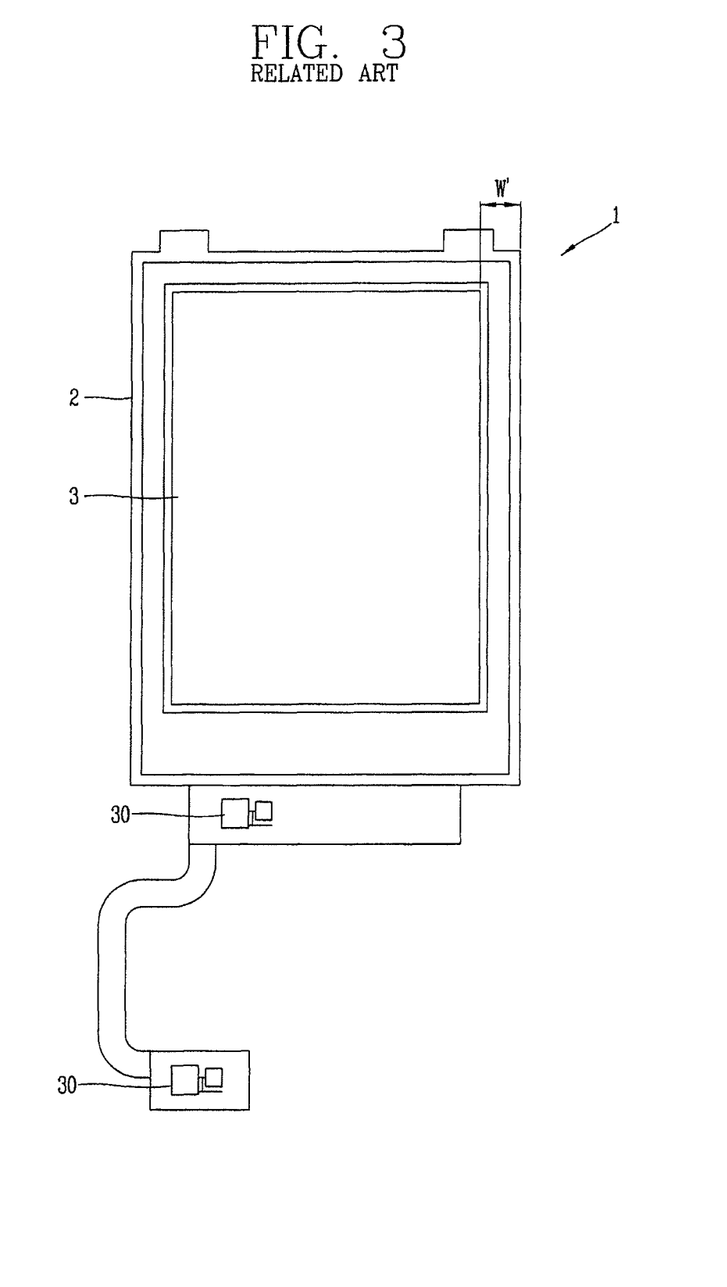
FIG. 3 is a view showing an example of a usage state of the related art OLED display device.

FIG. 3 is a view showing an example of a usage state of the related art OLED display device.

With reference to FIG. 3, a related art OLED display device 1 includes a light emission region 3 including an OLED and a circuit unit 30 electrically connected to a printed circuit board (PCB) and transferring a signal transferred from the PCB to the light emission region 3.

The light emission region 3 outputs a display image according to a signal received from the PCB through the circuit unit 30.

The related art OLED display device 1 includes an external appearance glass 2 attached on a front surface thereof so as to be used in a mobile communication terminal or an information terminal such as a digital TV, a computer, or the like, and in general, a space between an outer side of the external appearance glass 2 and the light emission region 3 is called a bezel width W'.

Figure 4:
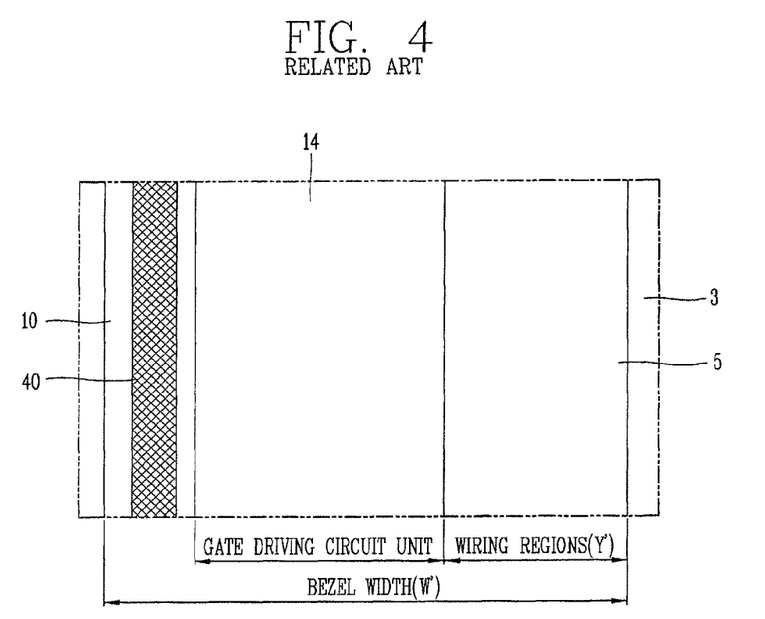
FIG. 4 is a plan view schematically showing a bezel region in the OLED display device illustrated in FIG. 3.

FIG. 4 is a plan view schematically showing the bezel region in the OLED display device illustrated in FIG. 3.

With reference to FIG. 4, in the related art OLED display device, the light emission region 3 displaying display information is formed on a substrate 10, and a plurality of pixels (not shown) of an OLED are formed in the light emission region 3.

Here, a gate driving circuit unit 14 is positioned on the side of the light emission region 3 and electrically connected to the PCB (not shown) to receive an external signal.

A sealant 40 is formed at an outer side of the gate driving circuit unit 14 to protect the gate driving circuit unit 14 and the light emission region 3 against impurities such as external moisture, oxygen, and the like.

A wiring region 5 in which a power (GND) wiring (not shown), an ON/OFF switch wiring (not shown), a reference wiring (not shown), or the like, are disposed is positioned between the gate driving circuit unit 14 and the light emission region 3.

As mentioned above, the space between an outer side of the substrate 10 and the light emission region 3 is called the bezel width W', and when the bezel width W' is large, dead spaces of the information terminal such as a mobile phone, or the like, is increased, defiling the outer appearance or design.

In particular, when the OLED display device is fabricated, a horizontal power wiring is led into the light emission region 3 by using portions of the left and right bezels. Here, in case of configuring a power source led in the horizontal direction using the left and right bezels, the additionally wiring region 5 is required in the bezel region in order to supply power, resulting in an increase in the bezel width W'.

Namely, as the OLED display device is advancing toward high resolution, layout of the power wiring such that the power wiring is led into the light emission region 3 in a vertical direction is not possible, so the power wiring is required to be designed in a horizontal direction within the pixel. Here, however, when the power wiring led into the light emission region 3 is horizontally disposed, the power wiring should be designed in the left and right wiring regions 5 by using a metal for a data wiring or a gate wiring, increasing the width Y' of the wiring regions 5, namely, the bezel width W'.

SUMMARY OF THE INVENTION

An aspect of the present invention provides an organic light emitting diode (OLED) display device having a reduced bezel width and a fabrication method thereof.

According to an aspect of the present invention, there is provided an organic light emitting diode (OLED) display device including: a light emission region displaying display information; a plurality of pixels formed in the light emission region; a data driving circuit unit formed on at least one side of the light emission region and a gate driving circuit unit formed on at least one side of the light emission region; a wiring region placed between the gate driving circuit unit and the light emission region and having a plurality of wirings disposed therein; first and second power wirings disposed in the wiring region and made of a metal used for a data wiring; and a first power wiring pattern made of a metal used for an anode and connected to the first power wiring and a second power wiring pattern made of the metal used for an anode and connected to the second power wiring.

The first power wiring pattern may be positioned on the first power wiring, and the second power wiring pattern may be positioned on the second power wiring.

The wirings formed in the wiring region may include a power wiring, an ON/OFF switch wiring or a reference wiring, and supply a signal or power to the pixels of the light emission region.

The organic light emitting diode (OLED) display device may further include: a dummy wiring disposed in the wiring region and made of a metal used for a gate wiring.

The dummy wiring may be electrically connected to the first power wiring or the second power wiring.

According to another aspect of the present invention, there is provided a method for an organic light emitting diode (OLED) display device including: providing a substrate divided into a light emission region outputting an image and a wiring region positioned at an outer side of the light emission region and having a plurality of wirings formed therein; forming a thin film transistor (TFT) on the substrate; forming first and second power wirings with metal used for a data wiring on the substrate of the wiring region; forming a planarization film on the substrate with the TFT and the first and second power wirings formed thereon; forming an anode on the planarization film, forming a first power wiring pattern on the first power wiring by using a metal used for the anode such that the first power wiring pattern is connected to the first power wiring, and forming a second power wiring pattern on the second power wiring by using the metal used for the anode such that the second power wiring pattern is connected to the second power wiring; forming a barrier rib demarcating a pixel region on the substrate with the anode, the first power wiring pattern and the second power wiring pattern formed thereon; forming an organic light emitting layer on the substrate with the barrier rib formed thereon; and forming a cathode on the organic light emitting layer.

The wirings formed in the wiring region may include a power wiring, an ON/OFF switch wiring or a reference wiring, and supply a signal or power to the pixels of the light emission region.

The method may further include: forming a dummy wiring with a metal used for a gate wiring on the substrate of the wiring region.

The dummy wiring may be electrically connected to the first power wiring or the second power wiring.

The barrier rib may be formed to cover the first power wiring pattern and expose the second power wiring pattern.

The metal used for the cathode may be formed to be connected to the exposed second power wiring pattern.

According to embodiments of the present invention, in the OLED display device and the fabrication method thereof, when the existing power wiring using the metal for a data wiring is divided based on a common electrode marginal region as a boundary so as to be used as a wiring as well as as the power wiring, and here, the reduced width of the wiring is compensated for by increasing the thickness of the wiring by using a metal for an anode or a cathode, thus reducing the left and right bezel widths. Thus, since the bezel widths are reduced, the use of an unnecessary space is reduced without defiling the outer appearance or design.

The foregoing and other objects, features, aspects and advantages of the present invention will become more apparent from the following detailed description of the present invention when taken in conjunction with the accompanying drawings.

DETAILED DESCRIPTION OF THE INVENTION

An OLED display device and a fabrication method according to embodiments of the present invention will be described in detail with reference to the accompanying drawings.

Figure 5:
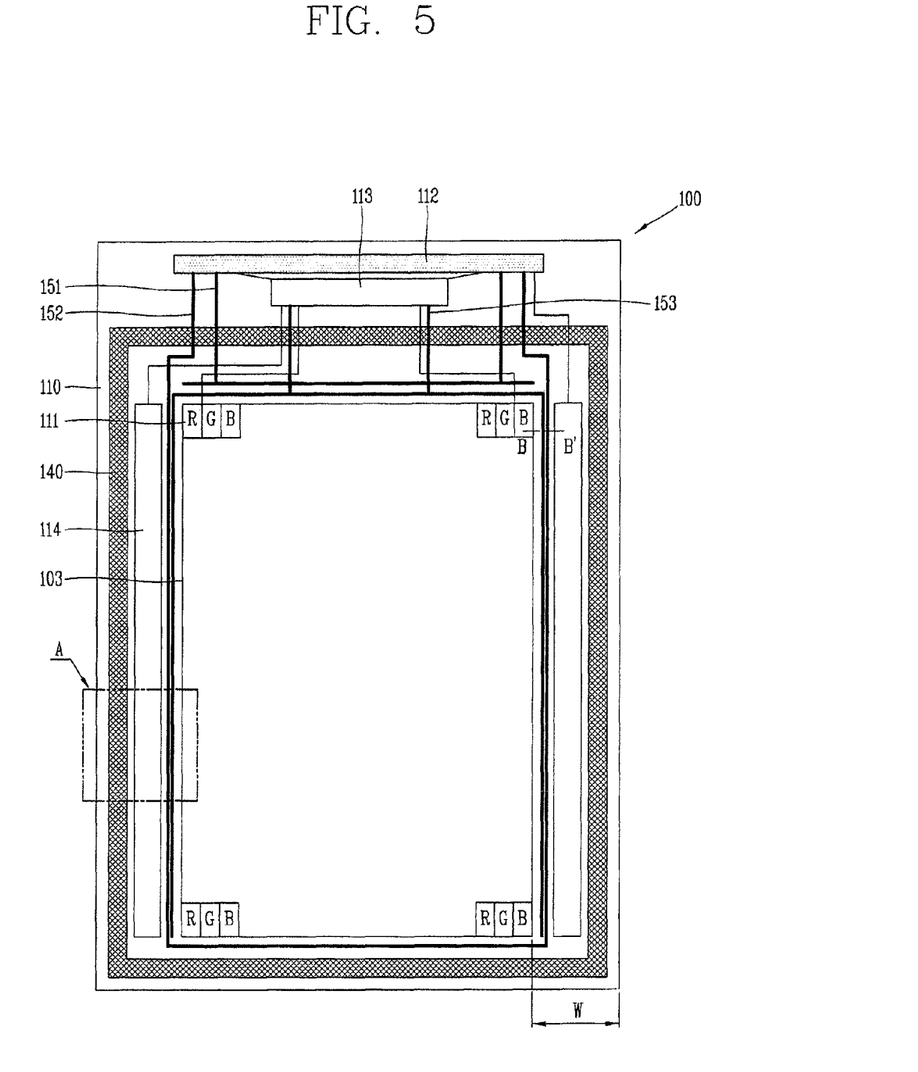
FIG. 5 is a plan view schematically showing an internal configuration of an OLED display device according to an embodiment of the present invention.

FIG. 5 is a plan view schematically showing an internal configuration of an OLED display device according to an embodiment of the present invention.

Figure 6:
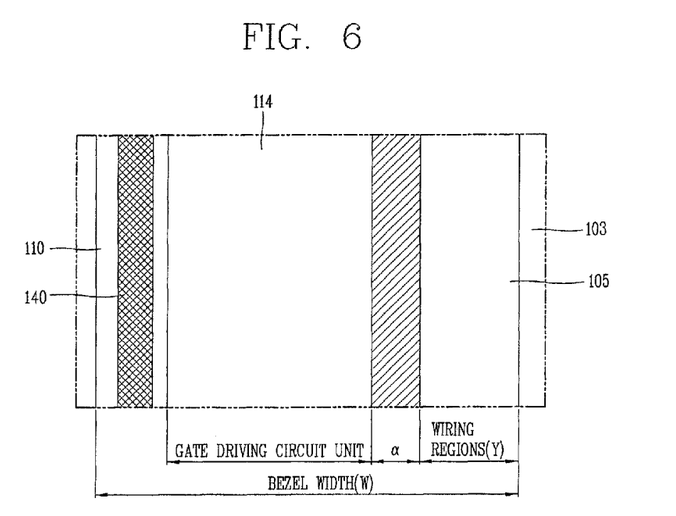
FIG. 6 is a plan view schematically showing a bezel region in the OLED display device illustrated in FIG. 5.

FIG. 6 is a plan view schematically showing a bezel region in the OLED display device illustrated in FIG. 5. Specifically, FIG. 6 is an enlarged view of portion 'A'.

With reference to FIGS. 5 and 6, the OLED display device 100 according to an embodiment of the present invention includes a light emission region 103 formed on a certain substrate 110 to display display information on, and a plurality of pixels 111 of an OLED are formed in the light emission region 103.

Here, a data driving circuit unit 113 is formed at an upper side of the light emission region 103, and gate driving units 114 are formed at left and right sides. The data driving circuit unit 113 and the gate driving circuit units 114 are electrically connected to a PCB 112 to receive external signal.

A sealant 140 is formed at an outer side of the gate driving circuit unit 114 to protect the gate driving circuit units 114 and the light emission region 103 from impurities such as external moisture, oxygen, or the like.

A wiring region 105 is positioned between the gate driving circuit unit 114 and the light emission region 103. A power wiring 151, an ON/OFF switch wiring (not shown), a reference wiring 153, and the like, are disposed on the wiring region 105.

Here, the power wiring 151 is a wiring connected to a reference voltage of a panel, and the ON/OFF switch wiring serves to turn on or turn off the switching TFT in changing scanning during driving.

Also, the reference wiring 153 is a wiring connected to a reference voltage of an input data signal, and reference numeral 152 denotes a data wiring.

As mentioned above, the space between an outer side of the substrate 110 and the light emission region 103 is called a bezel width (W), and when the bezel width W is large, dead spaces of the information terminal such as a mobile phone, or the like, is increased, defiling the outer appearance or design.

As the OLED display device 100 is advancing toward high resolution, layout of the power wiring led into the light emission region 3 in a vertical direction is not possible, so the power wiring is required to be designed in a horizontal direction within the pixel. Here, in the related art, when the power wiring led into the light emission region 3 is horizontally applied, the power wiring should be designed in the left and right wiring regions 5 by using a metal used for a data wiring or a gate wiring, increasing the bezel width W. In an embodiment of the present invention, the existing power wiring 151 is divided based on a common electrode marginal region as a boundary so as to be used as a wiring (not shown) as well as as the power wiring, and here, the reduced width of the wiring is compensated for by increasing the thickness of the wiring by using a metal used for an anode or a cathode, thus reducing the left and right bezel widths.

Namely, in the OLED display device 100, the wiring disposed in the bezel region is used as a power source for operating the pixels 111 within the light emission region 103, and in this case, when the metal for a data wiring or a gate wiring below the anode is used, the metal fixedly occupies the bezel region.

Thus, in an embodiment of the present invention, the existing power wiring 151 is divided based on the common electrode marginal region as a boundary so as to be used as a wiring as well as as the power wiring, and here, the reduced width of the wiring is compensated for by increasing the thickness of the wiring by using a metal used for an anode or a cathode formed in the bezel region, thus reducing the width Y of the wiring region 105, namely, the bezel width W. In this case, since power of the divided wirings is open to each other (namely, each power is not connected) by the common electrode based on the common electrode marginal region as a boundary, the separated power can be used. Thus, power used in the light emission region 103 can be supplied without having to add a bezel region for a power wiring.

Figure 7:
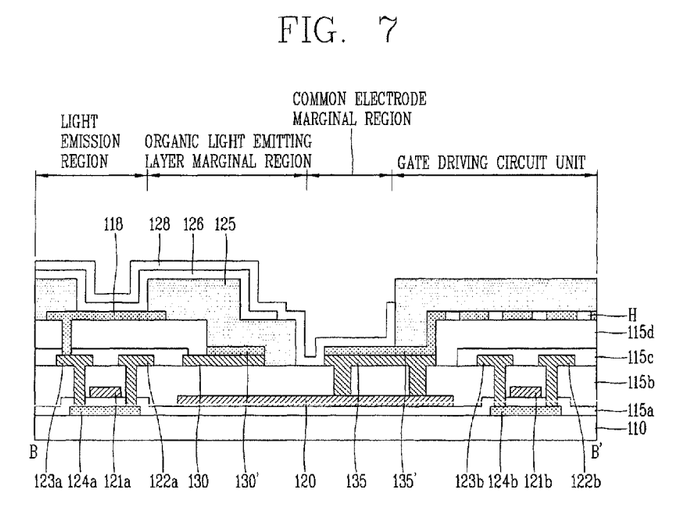
FIG. 7 is a sectional view taken along line B-B' in the OLED display device illustrated in FIG. 5.

FIG. 7 is a sectional view taken along line B-B' in the OLED display device illustrated in FIG. 5. In FIG. 7, the light emission region, the organic light emitting layer marginal region, the common electrode marginal region, and the gate driving circuit unit are sequentially illustrated from the left of the drawing.

As shown in FIG. 7, in the OLED display device according to an embodiment of the present invention, a first active layer 124a and a second active layer 124b, each being made of polycrystalline silicon, are formed on the substrate 110 made of an insulating material such as transparent glass, plastic, or the like.

Here, for the sake of explanation, it is assumed that a switching TFT and a driving TFT are formed in the light emission region and a gate driving TFT is formed in the gate driving circuit unit. Namely, for example, the first active layer 124a is formed on the substrate 110 of the light emission region and the second active layer 124b is formed on the substrate 110 of the gate driving circuit unit.

Here, in the embodiment of the present invention, the case in which the first active layer 124a and the second active layer 124b are made of polycrystalline silicon is taken as an example, but the present invention is not limited thereto, and the first active layer 124a and the second active layer 124b may be made of hydrogenated amorphous silicon or oxide semiconductor.

A gate insulating layer 115a made of silicon nitride (SiNx), silicon oxide ($SiO_2$), or the like, is formed on the substrate 110 including the first active layer 124a and the second active layer 124b, and a first gate electrode 121a, a gate line (not shown), a storage electrode (not shown), and a second gate electrode 121b (hereinafter, the first electrode 121a, the gate line, the storage electrode, and the second gate electrode 121b will be collectively called a 'gate wiring') are formed on the gate insulating layer 115a.

Here, the first gate electrode 121a and the second gate electrode 121b are positioned at an upper side of the first active layer 124a and the second active layer 124b, respectively.

A dummy wiring 120 made of the metal for a gate wiring may be formed in the organic light emitting layer marginal region and the common electrode marginal region. For reference, the organic light emitting layer marginal region and the common electrode marginal region refer to a wiring region.

A first passivation layer 115b made of silicon nitride, silicon oxide, or the like, is formed on the substrate 110 on which the first gate electrode 121a, the gate line, the storage electrode, and the second gate electrode 121b have been formed, and a data line (not shown), a driving voltage line (not shown), first source and drain electrodes 122a and 123a, and second source and drain electrodes 122b and 123b (hereinafter, the data line, the driving voltage line, the first source and drain electrodes 122a and 123a, and the second source and drain electrodes 122b and 123b will be collectively called a 'data wiring') are formed on the first passivation layer 115b.

Here, the first source electrode 122a and the drain electrode 123a face each other based on the first gate electrode 121a, and the second source electrode 122b and the second drain electrode 123b face each other based on the second gate electrode 121b.

Also, the first source and drain electrodes 122a and 123a are electrically connected to source and drain regions of the first active layer 124a through first contact holes, respectively, and the second source and drain electrodes 122b and 123b are electrically connected to the source and drain regions of the second active layer 124b through second contact holes.

Here, a first power wiring 130 and a second power wiring 135, each being made of metal for a data wiring, may be formed in the organic light emitting layer marginal region and the common electrode marginal region, respectively. The second power wiring 135 may be a reference wiring and may be electrically connected to an underlying dummy wiring 120 through a third contact hole, However, the present invention is not limited thereto and the first power wiring 130 and the dummy wiring 120 may be electrically connected through the third contact hole.

A second passivation film 115c made of silicon nitride, silicon oxide, or the like, is formed on the substrate 110 on which the data line, the driving voltage line, the first source and drain electrodes 122a and 123a, and the second source and drain electrodes 122b and 123b have been formed, and a planarization film 115d made of an organic insulating material such as photoacryl, or the like, is formed on the second passivation film 115c.

Here, a fourth contact hole exposing the first drain electrode 123a is formed in the planarization film 115d and the second passivation film 115c, and portions of the planarization film 115d and the second passivation film 115c in the organic light emitting layer marginal region and the common electrode marginal region are selectively removed to expose the first power wiring 130 and the second power wiring 135.

A pixel electrode 118 and a connecting electrode (not shown) are formed on the planarization film 115d. The pixel electrode 118 and the connecting electrode are made of a transparent conductive material such as indium-tin-oxide (ITO), indium-zinc-oxide (IZO), or the like, or a reflective conductive material such as aluminum, silver, an alloy thereof, or the like.

Here, the pixel electrode 118 as an anode is electrically connected to the first drain electrode 123a through the fourth contact hole.

Here, a power wiring pattern 130' is formed on the first power wiring 130 by using the metal for an anode and a second power wiring pattern 135' is formed on the second power wiring 135.

As mentioned above, when a horizontal wiring is led into the light emission region and used, a gap must be present between the first power wiring pattern 130' and the second power wiring pattern 135' to separate them.

In this manner, the first power wiring pattern 130' is formed on the first power wiring 130 and connected to the first power wiring 130, obtaining an effect that the thickness of the first power wiring 130 is substantially increased. Thus, the width of the wirings can be reduced in case of having the same wiring resistance.

Also, the second power wiring pattern 135' is formed on the second power wiring 135 and the dummy wiring 120 is formed at a lower side thereof and connected to the second power wiring 135, obtaining an effect that the thickness of the second power wiring 135 is substantially increased. Thus, the width of the wirings can be reduced in case of having the same wiring resistance.

Here, reference letter H denotes anode holes, and a barrier rib 125 is formed on the substrate 110 on which the pixel electrode 118, the first power wiring pattern 130', and the second power wiring pattern 135' have been formed.

Here, the barrier rib 125 surrounds the peripheral portions of the pixel electrode 118 like a bank to define an opening, and is made of an organic insulating material or an inorganic insulating material. The barrier 125 may also be made of a photosensitizer including black pigment, and in this case, the barrier rib 125 serves as a light blocking member.

The barrier rib 125 according to an embodiment of the present invention covers the first power wiring pattern 130' formed in the organic light emitting marginal region and exposes a portion of the second power wiring pattern 135' formed in the common electrode marginal region, but the present invention is not limited thereto.

A certain organic light emitting layer 126 is formed on the substrate 110 on which the barrier rib 125 has been formed.

Here, the organic light emitting layer 126 may have a multi-layered structure including a light emitting layer emitting light and an auxiliary layer for improving luminous efficiency of the light emitting layer. The auxiliary layer may include an electron transport layer and a hole transport layer for balancing electrons and holes and an electron injection layer and a hole injection layer for strengthening injection of electrons and holes.

A common electrode 128 as a cathode is formed on the organic light emitting layer. Here, the common electrode 128 receives a common voltage and may be made of a reflective conductive material including calcium (Ca), barium (Ba), magnesium (Mg), aluminum (Al), silver (Ag), and the like, or a transparent conductive material such as ITO, IZO, or the like.

A metal for a cathode constituting the common electrode 128 is connected to the exposed portion of the second power wiring pattern 135'.

In this manner, it is noted that, when the dummy electrodes such as the dummy wiring 120, the first power wiring pattern 130', the second power wiring pattern 135', and the like, are used, an effect that the thickness of the power wirings 130 and 135 is substantially increased can be obtained, so the wiring resistance is reduced.

Here, since the wiring resistance is reduced, the width of the power wirings 130 and 135 may be reduced, and a different signal line or wiring may be additionally formed by the reduced width (i.e., 'α' in FIG. 6).

For example, when the dummy electrodes are used, lateral resistance can be reduced to be about 1/13 in comparison to the case in which the dummy electrodes are not used, and when the dummy electrodes are not used, a wiring region having a width of about 600 μm is required, but when the dummy electrodes are used, only a wiring region having a width of about 550 μm is required. As a result, the remaining 50 μm can be used for a signal line or wiring in a different region.

A method for fabricating the OLED display device according to an embodiment of the present invention configured as described above will be described in detail with reference to the accompanying drawings.

FIGS. 8A through 8I are sectional views sequentially showing a method for fabricating the OLED display device illustrated in FIG. 7. In FIGS. 8A through 8I show a case of a method for fabricating the light emission region, the organic light emitting layer marginal region, the common electrode marginal region, and the gate driving circuit unit in order from the left in the drawings, as an example.

Figure 8A:
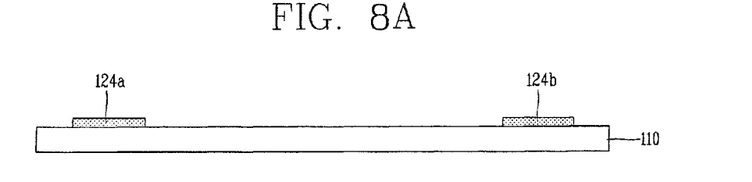
FIGS. 8A through 8I are sectional views sequentially showing a method for fabricating the OLED display device illustrated in FIG. 7.

As shown in FIG. 8A, a buffer layer (not shown) and a silicon film are formed on the substrate 110 made of an insulating material such as transparent glass, plastic, or the like.

Here, the buffer layer serves to prevent impurities such as natrium (Na), or the like, present within the substrate 110 from infiltrating into an upper layer during the process.

The silicon film may be made of an amorphous silicon or polycrystalline silicon, but in an embodiment of the present invention, the case in which a TFT is formed by using polycrystalline silicon is taken as an example. Here, the polycrystalline silicon may be formed by depositing amorphous silicon on the substrate 110 and then performing various crystallization methods. This will be described as follows.

First, the amorphous silicon can be deposited according to various methods. Typical methods of depositing the amorphous silicon include a low pressure chemical vapor deposition (LPCVD) and a plasma enhanced chemical vapor deposition (PECVD).

Methods for crystallizing the amorphous silicon include a solid phase crystallization (SPC) method which thermally treats amorphous silicon in a high temperature furnace and an eximer laser annealing (ELA) method using a laser.

As the laser crystallization, the ELA using laser having a pulse form is commonly used, and recently, a sequential lateral solidification (SLS) which remarkably improves the crystallization characteristics by growing grains in a horizontal direction has been studied.

Thereafter, the silicon film is selectively removed through a photolithography process to form the first active layer 124a and the second active layer 124b made of the polycrystalline silicon.

Here, for the sake of explanation, it is assumed that the switching TFT and the driving TFT are formed in the light emission region and the gate driving TFT is formed in gate driving circuit unit. Namely, for example, the first active layer 124a is formed on the substrate 110 of the light emitting region and the second active layer 124b is formed on the substrate 110 of the gate driving circuit unit.

Here, as mentioned above, in an embodiment of the present invention, the case in which the first active layer 124a and the second active layer 124b are made of polycrystalline silicon is taken as an example, but the present invention is not limited thereto and the first active layer 124a and the second active layer 124b may be made of hydrogenated amorphous silicon or oxide semiconductor.

Meanwhile, when the first active layer 124a and the second active layer 124b are made of hydrogenated amorphous silicon, n+ amorphous silicon may be deposited along with amorphous silicon and patterned to form a resistive contact member, and in this case, a TFT may be formed to have a top gate structure, instead of a coplanar structure. In this manner, the present invention can be applicable regardless of the material constituting the first active layer 124a and the second active layer 124b and the corresponding structure of the TFT.

Figure 8B:
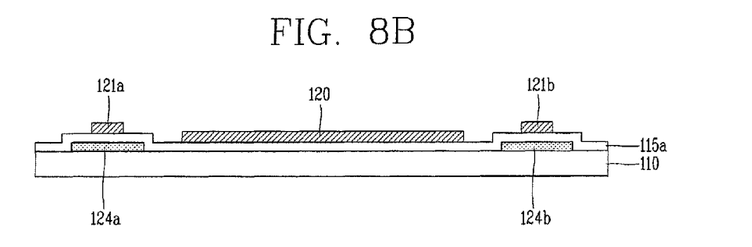

Next, as shown in FIG. 8B, the gate insulating layer 115a made of silicon nitride, silicon oxide, or the like, is formed on the substrate 110 with the first active layer 124a and the second active layer 124b formed thereon to form the first gate electrode 121a, a gate line (not shown), a storage electrode (not shown), and the second gate electrode 121b on the gate insulating layer 115a.

Here, the first gate electrode 121a, the gate line, the storage electrode, and the second gate electrode are formed by depositing a first conductive film on the entire surface of the substrate 110 and selectively patterning the first conductive film through a photolithography process.

Here, the first conductive film may be made of a low-resistivity opaque conductive material such as aluminum-based metal such as aluminum (Al), an aluminum alloy, etc., silver-based metal such as silver (Ag), a silver alloy, etc., a copper-based metal such as copper (Cu), a copper alloy, etc., molybdenum-based metal such as molybdenum (Mo), a molybdenum alloy, etc., chromium (Cr), tantalum (Ta), titanium (Ti), and the like. Also, the first conductive film may have a multilayered structure including two conductive films each having different physical qualities. When the first conductive film has a multilayered structure, one conductive film may be made of metal of low resistivity, for example, aluminum-based metal, silver-based metal, copper-based metal, or the like, capable of reducing signal delay or a voltage drop, and the other conductive film may be made of a different material, which has excellent physical, and chemical electrical contact characteristics with ITO and IZO, e.g., molybdenum-based metal, chromium, titanium, tantalum, or the like.

A lateral face (or the side) of each of the first gate electrode 121a, the gate line, the storage electrode, and the second gate electrode 121b may be sloped toward the surface of the substrate 110, and in this case, the slope angle may range from 30° to 80°.

The first gate electrode 121a and the second gate electrode 121b are disposed on the first active layer 124a and the second active layer 124b, respectively.

Here, as mentioned above, the dummy wiring 120 made of the metal for a gate wiring may be formed in the organic light emitting layer marginal region and the common electrode marginal region.

Figure 8C:
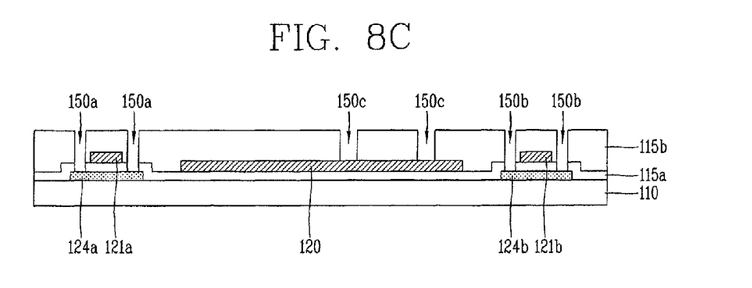

Next, as shown in FIG. 8C, the first passivation film 115b made of silicon nitride, silicon oxide, or the like, is formed on the entire surface of the substrate 110 with the first gate electrode 121a, the gate line, the storage electrode, and the second gate electrode 121b formed thereon, and the first passivation film 115b and the gate insulating film 115a are selectively removed through a photolithography process to form the first contact hole 150a exposing the source and drain regions of the first active layer 124a and the second contact hole 150b exposing the source and drain regions of the second active layer 124b.

Also, the first passivation film 115b is selectively removed through the photolithography process to form the third contact hole 150c exposing the dummy wiring 120.

Figure 8D:
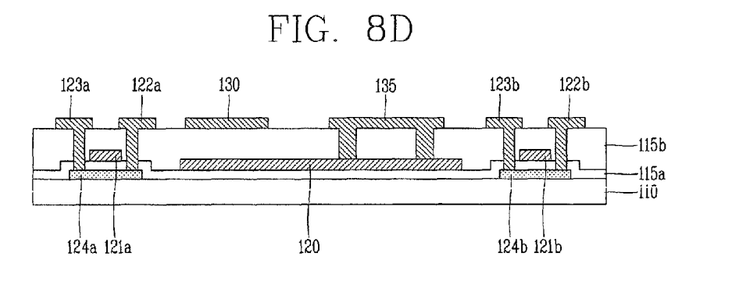

And then, as shown in FIG. 8D, a second conductive film is formed on the entire surface of the substrate 110 with the first passivation film 115b formed thereon, and then, selectively removed through a photolithography process to form the data line (not shown) formed of the second conductive film, the driving voltage line (not shown), the first source and drain electrodes 122a and 123a, and the second source and drain electrodes 122b and 123b.

Here, the first source electrode 122a and the first drain electrode 123a face each other based on the first gate electrode 121a, and the second source electrode 122b and the second drain electrode 123b face each other based on the second gate electrode 121b.

Also, the first source and drain electrodes 122a and 123a are electrically connected to the source and drain regions of the first active layer 124a through the first contact hole, and the second source and drain electrodes 122b and 123b are electrically connected to the source and drain regions of the second active layer 124b through the second contact hole.

Here, the first power wiring 130 and the second power wiring 135, each being made of the metal for a data wiring, may be formed in the organic light emitting layer marginal region and the common electrode marginal region, respectively. The second power wiring 135 may be a reference wiring and may be electrically connected to the underlying dummy wiring 120 through the third contact hole. However, the present invention is not limited thereto, and the first power wiring 130 may be electrically connected to the dummy wiring 120 through the third contact hole.

Here, the second conductive film may be made of a low-resistivity opaque conductive material such as aluminum-based metal such as aluminum (Al), an aluminum alloy, etc., silver-based metal such as silver (Ag), a silver alloy, etc., a copper-based metal such as copper (Cu), a copper alloy, etc., molybdenum-based metal such as molybdenum (Mo), a molybdenum alloy, etc., chromium (Cr), tantalum (Ta), titanium (Ti), and the like. Also, the second conductive film may have a multilayered structure including two conductive films each having different physical qualities. When the second conductive film has a multilayered structure, one conductive film may be made of metal of low resistivity, for example, aluminum-based metal, silver-based metal, copper-based metal, or the like, capable of reducing signal delay or a voltage drop, and the other conductive film may be made of a different material, which has excellent physical, and chemical electrical contact characteristics with ITO and IZO, e.g., molybdenum-based metal, chromium, titanium, tantalum, or the like.

The lateral face of each of the data line, the driving voltage line, the first source and drain electrodes 122a and 123a, and the second source and drain electrodes 122b and 123b may be sloped to the surface of the substrate 110 at about 30° to 80°.

Figure 8E:
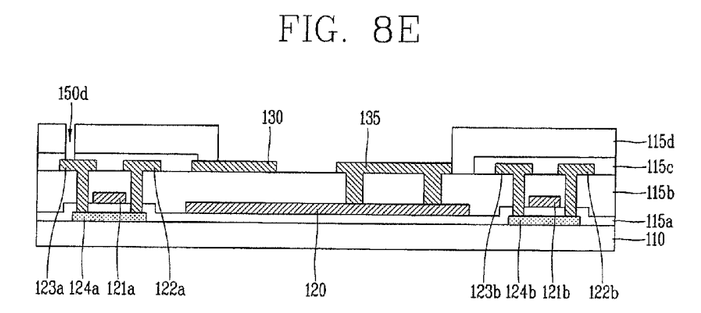

Thereafter, as shown in FIG. 8E, the second passivation film 115c made of silicon nitride, silicon oxide, or the like, is formed on the entire surface of the substrate 110 with the data line, the driving voltage line, the first source and drain electrodes 122a and 123a, the second source and drain electrodes 122b and 123b, and the first power wiring 130 and the second power wiring 135 formed thereon, and then, the polarization film 115d made of an organic insulating material such as photo acryl is formed on the second passivation film 115c.

Thereafter, the planarization film 115d and the second passivation film 115c are selectively removed through a photolithography process to form a fourth contact hole 150d, and, meanwhile, the planarization film 115d and the second passivation film 115c in the organic light emitting layer marginal region and the common electrode marginal region are selectively removed to expose the first power wiring 130 and the second power wiring 135.

Figure 8F:
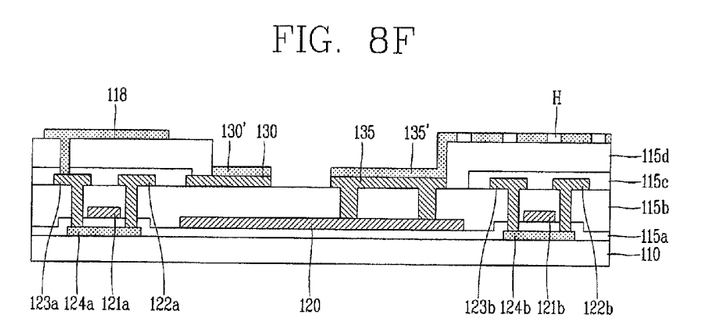

And then, as shown in FIG. 8F, a third conductive film is deposited on the entire surface of the substrate 110 with the polarization film 115d formed thereon, and then, selectively removed through a photolithography to form the pixel electrode 118 and the connection electrode (not shown) formed of the third conductive film.

Here, the third conductive film may be made of a transparent conductive material such as ITO, IZO, or the like.

Also, the pixel electrode 118 as an anode is electrically connected to the first drain electrode 123a through the fourth contact hole.

Here, the first power wiring pattern 130' is formed on the first power wiring 130 by using the metal for an anode, and the second power wiring pattern 135' is formed on the second power wiring 135.

As mentioned above, when the horizontal wiring is led into the light emission region and used, the first power wiring pattern 130' and the second power wiring pattern 135' have a certain gap therebetween.

In this manner, since the first power wiring pattern 130' is formed on the first power wiring 130 and connected to the first power wiring 130, the effect of substantially increasing the thickness of the first power wiring 130 can be obtained, so the width of the wiring can be reduced in case of having the same wiring resistance.

Also, since the second power wiring pattern 135' is formed on the second power wiring 135 and dummy wiring 120 are formed under the second power wiring 135 and connected to the second power wiring 135, the effect of substantially increasing the thickness of the second power wiring 135 can be obtained, so the width of the wiring can be reduced in case of having the same wiring resistance.

Figure 8G:
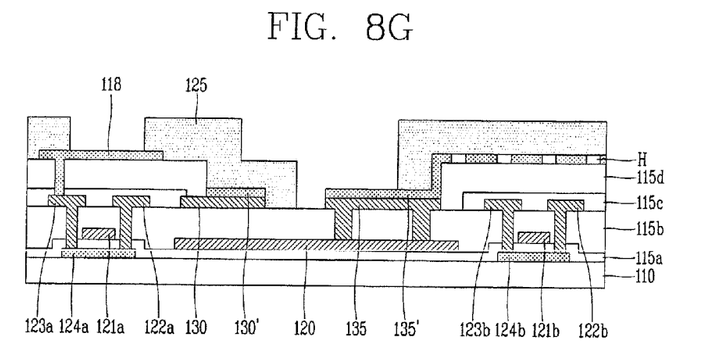

Next, as shown in FIG. 8G, the barrier rib 125 demarcating the sub-pixels is formed on the substrate 110 with the pixel electrode 118, the connection electrode, the first power wiring pattern 130', and the second power wiring pattern 135' formed thereon.

Here, the barrier rib 125 surrounds the peripheral portions of the pixel electrode 118 like a bank to define an opening, and is made of an organic insulating material or an inorganic insulating material. The barrier 125 may also be made of a photosensitizer including black pigment, and in this case, the barrier rib 125 serves as a light blocking member.

The barrier rib 125 according to an embodiment of the present invention covers the first power wiring pattern 130' formed in the organic light emitting marginal region and exposes a portion of the second power wiring pattern 135' formed in the common electrode marginal region, but the present invention is not limited thereto.

Figure 8H:
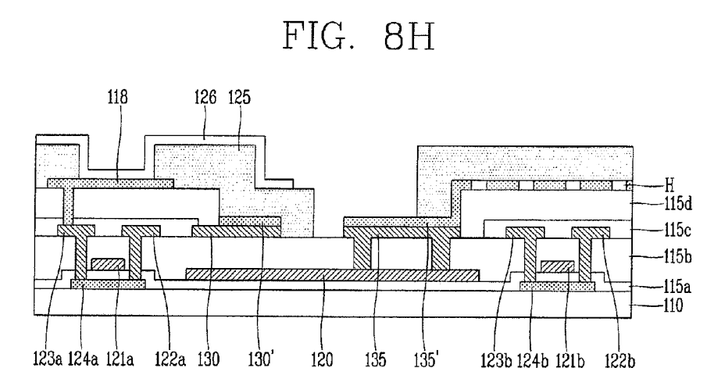

And, as shown in FIG. 8H, the organic light emitting layer 126 is formed on the substrate 110 on which the barrier rib 125 has been formed.

As mentioned above, the organic light emitting layer 126 may have a multi-layered structure including a light emitting layer emitting light and an auxiliary layer for improving luminous efficiency of the light emitting layer. The auxiliary layer may include an electron transport layer and a hole transport layer for balancing electrons and holes and an electron injection layer and a hole injection layer for strengthening injection of electrons and holes.

Figure 8I:
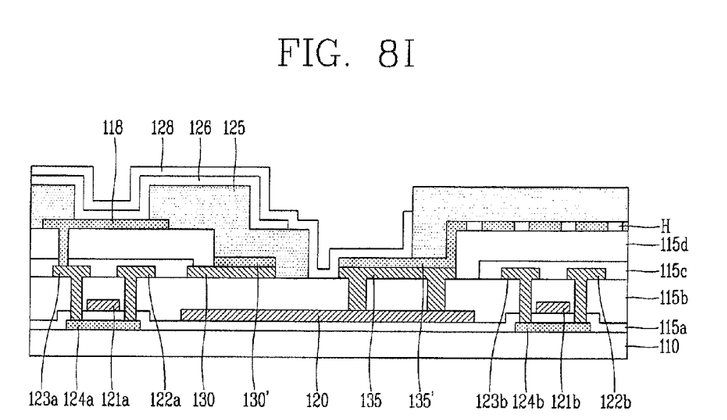

As shown in FIG. 8I, the common electrode 128 as a cathode is formed on substrate 110 with the organic light emitting layer formed thereon.

Here, the common electrode 128 receives a common voltage and may be made of a reflective conductive material including calcium (Ca), barium (Ba), magnesium (Mg), aluminum (Al), silver (Ag), and the like, or a transparent conductive material such as ITO, IZO, or the like.

A metal for a cathode constituting the common electrode 128 is connected to the exposed portion of the second power wiring pattern 135'.

In this manner, it is noted that, when the dummy electrodes such as the dummy wiring 120, the first power wiring pattern 130', the second power wiring pattern 135', and the like, are used, an effect that the thickness of the power wirings 130 and 135 is substantially increased can be obtained, so the wiring resistance is reduced.

Here, since the wiring resistance is reduced, the width of the power wirings 130 and 135 may be reduced, and a different signal line or wiring may be additionally formed by the reduced width.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabrication of an organic light emitting diode (OLED) display device comprising:
   providing a substrate divided into a light emission region outputting an image and a wiring region placed between a gate driving circuit unit and the light emission region and having a plurality of wirings formed therein;
   forming a switching thin film transistor (TFT) and a driving TFT on the substrate;
   forming first and second power wirings on the wiring region of the substrate;
   forming a planarization film on the substrate on which the switching and driving TFTs and the first and second power wirings are formed;
   forming an anode on the planarization film;
   forming a first power wiring pattern directly along a length of the first power wiring and connected to the first power wiring, and forming a second power wiring pattern directly along a length of the second power wiring and connected to the second power wiring, the second power wiring pattern having an extending portion to cover the driving TFT;
   forming a barrier rib demarcating a pixel region, and covering the first power wiring pattern and exposing a portion of the second power wiring pattern on the substrate on which the anode, the first power wiring pattern and the second power wiring pattern are formed;
   forming an organic light emitting layer on the substrate on which the barrier rib is formed; and
   forming a cathode connecting to the exposed portion of the second power wiring pattern on the organic light emitting layer.

2. The method of claim 1, further comprising anode holes formed in the extending portion of the second power wiring pattern.

3. The method of claim 1, further comprising:
   forming a dummy wiring with a metal used for a gate wiring on the wiring region of the substrate, wherein the dummy wiring and the gate wiring are formed through a same masking process.

4. The method of claim 3, wherein the dummy wiring is electrically connected to the first power wiring or the second power wiring through a contact hole.

5. The method of claim 1, wherein the first and second power wirings are formed with a metal used for a data wiring, and
   wherein the first and second power wirings and the data wiring are formed through a same masking process.

6. The method of claim 5, wherein the first and second power wiring patterns are formed with a metal used for the anode, and
   wherein the first and second power wiring patterns and the anode are formed through a same masking process.

7. The method of claim 1, wherein a portion of the planarization film contacts the first power wiring, and the first power wiring pattern contacts both the planarization film and the first power wiring, and
   wherein the extending portion of the second power wiring pattern is formed on another portion of the planarization film.

8. An organic light emitting diode (OLED) display device comprising:
   a substrate divided into a light emission region displaying display information and a wiring region placed between a gate driving circuit unit and the light emission region and having a plurality of wirings disposed therein;
   a switching thin film transistor (TFT) and a driving TFT on the substrate;
   first and second power wirings disposed in the wiring region of the substrate;
   a planarization film formed on the substrate on which the first and second power wirings are formed;
   an anode formed on the planarization film;
   a first power wiring pattern formed directly along a length of the first power wiring and connected to the first power wiring;
   a second power wiring pattern formed directly along a length of the second power wiring and connected to the second power wiring, the second power wiring pattern having an extending portion to cover the driving TFT;
   a barrier rib formed on the substrate on which the anode, the first power wiring pattern and the second power wiring pattern are formed to cover the first power wiring pattern and expose a portion of the second power wiring pattern;
   an organic light emitting layer formed on the substrate on which the barrier rib is formed; and
   a cathode formed on the organic light emitting layer to connect to the exposed portion of the second power wiring pattern.

9. The display device of claim 8, wherein the first and second power wirings are made of a metal used for a data wiring, and
   wherein the first and second power wirings and the data wiring are formed in a same layer on the substrate.

10. The display device of claim 9, wherein the first and second power wiring patterns are made of a metal used for the anode, and
    wherein the first and second power wiring patterns and the anode are formed in a same layer on the substrate.

11. The display device of claim 8, further comprising anode holes formed in the extending portion of the second power wiring pattern.

12. The display device of claim 8, further comprising:
    a dummy wiring disposed in the wiring region and made of a metal used for a gate wiring, wherein the dummy wiring and the gate wiring are formed in a same layer on the substrate.

13. The display device of claim 8, wherein a portion of the planarization film contacts the first power wiring, and the first power wiring pattern contacts both the planarization film and the first power wiring, and wherein the extending portion of the second power wiring pattern is formed on another portion of the planarization film.

\* \* \* \* \*